United States Patent
Kalluri et al.

(10) Patent No.: US 12,451,883 B2
(45) Date of Patent: Oct. 21, 2025

(54) SHOOT THROUGH PROTECTION IN MOTOR DRIVES WITH SINGLE SUPPLY GATE DRIVES

(71) Applicant: Hamilton Sundstrand Corporation, Charlotte, NC (US)

(72) Inventors: Nageswara Rao Kalluri, Bangalore (IN); Rajkumar Perumal, Bangalore (IN); Sridhar Katakam, Bangalore (IN); Surendra Somasekhar Valleru, Bangalore (IN); Pravinsharma Kaliyannan Eswaran, Bangalore (IN)

(73) Assignee: Hamilton Sundstrand Corporation, Charlotte, NC (US)

( * ) Notice: Subject to any disclaimer, the term of this patent is extended or adjusted under 35 U.S.C. 154(b) by 82 days.

(21) Appl. No.: 18/222,620

(22) Filed: Jul. 17, 2023

(65) Prior Publication Data

US 2024/0088891 A1    Mar. 14, 2024

(30) Foreign Application Priority Data

Sep. 13, 2022   (IN) .............................. 202241052245

(51) Int. Cl.
*H03K 17/689* (2006.01)
*H02P 29/00* (2016.01)
*H03K 17/56* (2006.01)

(52) U.S. Cl.
CPC ............. *H03K 17/56* (2013.01); *H02P 29/00* (2013.01)

(58) Field of Classification Search
CPC .... H02P 29/00; H03K 17/162; H03K 17/168; H03K 17/689; H03K 17/08122; H03K 17/56; H03K 17/08128; H03K 2217/0063; H03K 2217/0072
USPC ........................................................ 318/504
See application file for complete search history.

(56) References Cited

U.S. PATENT DOCUMENTS

| | | | | |
|---|---|---|---|---|
| 5,546,033 | A | * | 8/1996 | Campbell ........ H03K 19/00361 257/E27.11 |
| 6,326,819 | B1 | * | 12/2001 | Carlson ................ H03K 17/163 327/108 |
| 6,542,012 | B2 | | 4/2003 | Kim |
| 9,584,046 | B2 | | 2/2017 | Sicard |
| 9,590,618 | B2 | | 3/2017 | Sicard et al. |
| 9,774,244 | B2 | | 9/2017 | Cyr |
| 10,505,538 | B1 | * | 12/2019 | Alam ............... H03K 19/00369 |

(Continued)

FOREIGN PATENT DOCUMENTS

JP     7099199 B2    7/2022

OTHER PUBLICATIONS

Supplementary European Search Report dated Feb. 21, 2024 in connection with European Patent Application No. 23197196.1, 9 pages.

*Primary Examiner* — Gabriel Agared

(57) ABSTRACT

A switch control system includes a first voltage source configured to output a first source voltage on a first voltage line. The system includes a first gate driver, a second gate driver, a third gate driver, and a fourth gate driver. Each of the gate drivers includes shoot through protection (STP) configured to prevent a first switch and a second switch of the system from ever both being closed at once thereby preventing shoot voltages from a DC bus to ground through the first and second switches.

20 Claims, 3 Drawing Sheets

(56) References Cited

U.S. PATENT DOCUMENTS

2014/0292395 A1* 10/2014 Wu .................... H10D 62/8503
327/434
2019/0348977 A1* 11/2019 Kusakari ................ H03K 17/06
2020/0076425 A1* 3/2020 Garg .................. H03K 17/6871

* cited by examiner

*Fig. 3*

| Working Condition | Gate_Top Voltage Logic | Gate_Bot Voltage Logic | Vg_top | Vs/e_top | Voltage across Vg_top w.r.t Vs/e_top | Vg_bot | Vs/e_bot | Voltage across Vg_bot w.r.t Vs/e_bot |
|---|---|---|---|---|---|---|---|---|
| Normal* | High | Low | +$V_{GD}$ | 0 | +$V_{GD}$ | 0 | +$V_{GD}$ | -$V_{GD}$ |
|  | Low | High | 0 | +$V_{GD}$ | -$V_{GD}$ | +$V_{GD}$ | 0 | +$V_{GD}$ |
| Fault* | Low | Low | 0 | 0 | 0 | 0 | 0 | 0 |
|  | High | High | +$V_{GD}$ | +$V_{GD}$ | 0 | +$V_{GD}$ | +$V_{GD}$ | 0 |

TABLE 1

SHOOT THROUGH PROTECTION IN MOTOR DRIVES WITH SINGLE SUPPLY GATE DRIVES

CROSS REFERENCE TO RELATED APPLICATIONS

This application claims priority to Indian Provisional Patent Application No. IN 202241052245, filed Sep. 13, 2022. The entire contents of this application are incorporated herein by reference in their entirety.

BACKGROUND

1. Field

The present disclosure relates to gate drive systems, and more particularly to gate drive systems for power switching devices such as used in electric motor controls.

2. Description of Related Art

Power switches can be used in motor controls and other power control applications. Each power switch, e.g. a top switch and a bottom switch, is controlled by a gate driver connected to its gate, e.g. for pulse width modulated (PWM) control signals. It is imperative that both switches not be turned on at the same time in order to safeguard the motor drive unit.

In conventional designs, shoot through protection (STP) is included in a PWM signal path as part of the gate driver. However, SPT features are very specific to the gate driver architecture and even to the supplier. It can be difficult to ensure existing STP features will work in all conditions for gate driver architectures other than the specific architecture for which the STP feature was designed.

The conventional techniques have been considered satisfactory for their intended purpose. However, there is an ever present need for improved systems and methods for shoot through protection for gate drivers. This disclosure provides a solution for this need.

SUMMARY

A switch control system includes a first voltage source configured to output a first source voltage on a first voltage line. A first gate driver is connected to a first gate control signal line to receive a gate control signal from a controller. The first gate driver is connected to the first voltage line to receive the first source voltage. The first gate driver is connected to a first terminal line to output a first gate voltage signal to a first terminal of a first switch.

A second gate driver is connected to a second gate control signal line to receive a gate control signal from the controller. The second gate driver is connected to the first voltage line to receive the first source voltage. The second gate driver is connected to a second terminal line to output a second gate voltage signal to a second terminal of the first switch. A second voltage source is configured to output a second source voltage on a second voltage line.

A third gate driver is connected to the first gate control signal line to receive a gate control signal from a controller. The third gate driver is connected to the second voltage line to receive the second source voltage. The third gate driver is connected to a third terminal line to output a third gate voltage signal to a first terminal of a second switch.

A fourth gate driver is connected to the second gate control signal line to receive a gate control signal from the controller. The fourth gate driver is connected to the second voltage line to receive the second source voltage. The fourth gate driver is connected to a fourth terminal line to output a third gate voltage signal to a second terminal of the second switch.

Each of the first gate driver, the second gate driver, the third gate driver, and the fourth gate driver includes shoot through protection (STP) configured to prevent the first switch and the second switch from ever both being closed at once thereby preventing shoot voltages from a DC bus to ground through the first and second switches.

The first and second voltage sources can be two separate isolated positive voltage sources. The system can include the first and second switches connected to the respective first through fourth gate drivers. Each switch can be a MOSFET or an IGBT. The STP can include a logic component, e.g. glue logic, connected in the first and second gate control signal lines between the controller and the gate drivers. The logic component can include logic configured to cause the gate drivers to open both the first and the second switch if the controller signals a logic high on both the first and second gate control signal lines simultaneously. The logic component can include logic configured to cause the gate drivers to open both the first and the second switch if the controller signals a logic low on both the first and second gate control signal lines simultaneously The STP can include logic configured to command the first and second gate control signal lines according to the normal working condition as listed in TABLE 1 of FIG. 3 during normal operation. The STP can include logic configured to command the first and second gate control signal lines according to the fault working condition as listed in TABLE 1 of FIG. 3 during faulted operation.

The first terminal of each of the first and second switches can be a respective gate. The second terminal of each of the first and second switches can be a respective source or emitter. The first gate voltage signal and the second gate voltage signal can be exactly inverted to cause gate voltage at the switch to be bipolar. Each of the first through fourth gate drivers can be connected to a ground via a ground line. Each gate driver can be configured to selectively output the source voltage or ground voltage as a function of the gate control signal from the controller.

When the output of the first and third gate drivers is the source voltage, the output of the second and fourth gate drivers can be ground voltage such that the gate of each switch is connected to the source voltage and the source or emitter of each switch is connected to ground voltage. When the output of the first and third gate drivers is ground voltage, the output of the second and fourth gate drivers can be the source voltage such that the gate of each switch is connected to the ground voltage and the source or emitter of each switch is connected to source voltage.

The first gate driver and the second gate driver can be integrated in a first single integrated circuit such that the system includes a single voltage line to the first single integrated circuit and a single ground line from the first single integrated circuit. The third gate driver and the fourth gate driver can be integrated in a second single integrated circuit such that the system includes a single voltage line to the second single integrated circuit and a single ground line from the second single integrated circuit. It is also contemplated that the first gate driver, the second gate driver, the third gate driver, and the fourth gate driver can each be hosted on separate integrated circuits such that the system includes a two voltage line branches and two ground line branches.

The system can include an electric motor control assembly. The electric motor control assembly can include the first and second switches wherein the second terminal of the first switch is connected to a third terminal of the second switch, and wherein a motor phase line is connected to a line connecting the second terminal of the first switch to the third terminal of the second switch.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 3 includes TABLE 1, which is a table listing gate input and gate drive output for the system of FIGS. 1 and 2.

DETAILED DESCRIPTION OF THE PREFERRED EMBODIMENTS

Figure 1:
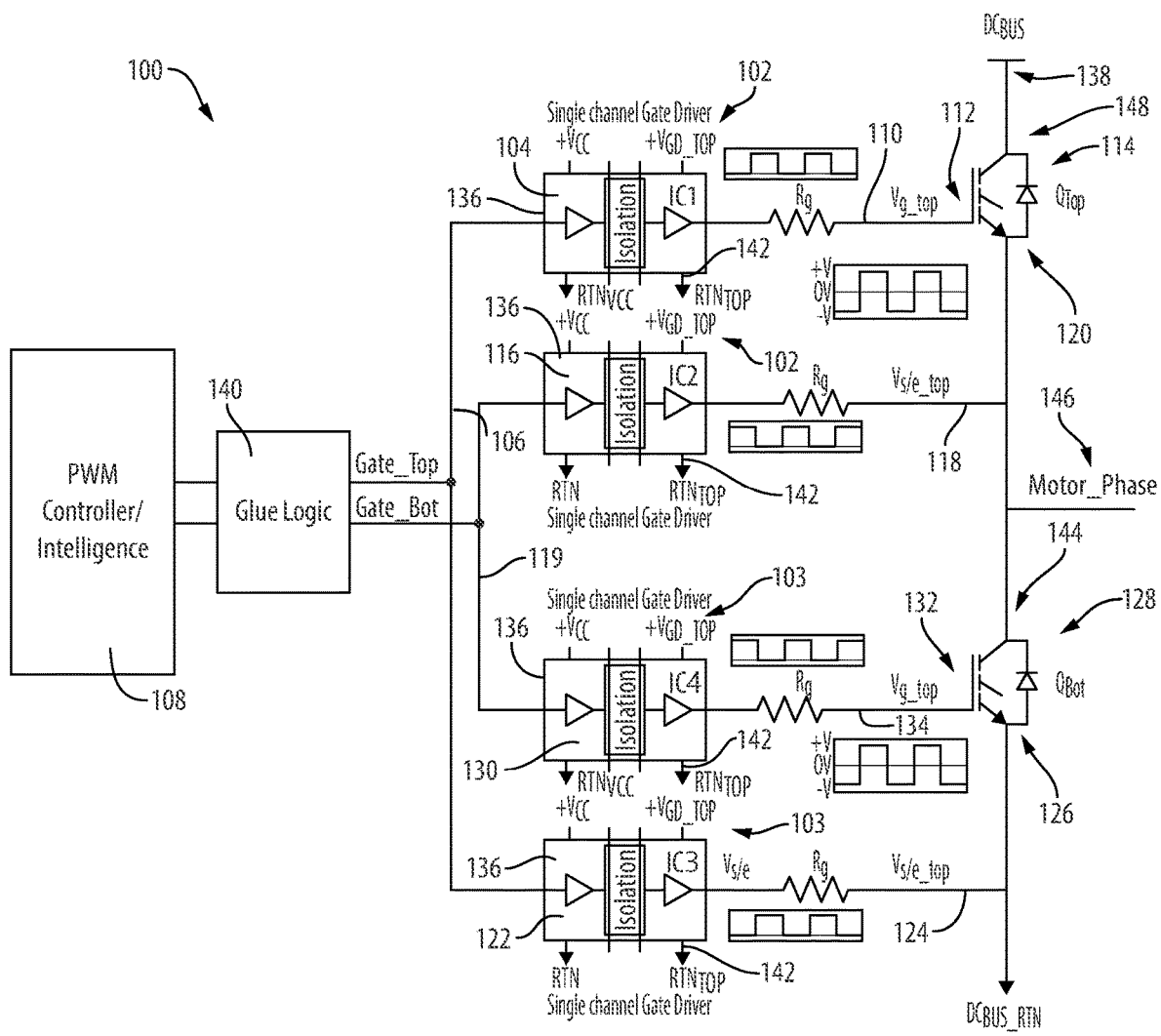
FIG. 1 is a schematic view of an embodiment of a system constructed in accordance with the present disclosure, showing four gate drivers with shoot through protection (STP), wherein each gate driver is hosted on its own separate integrated circuit.

Reference will now be made to the drawings wherein like reference numerals identify similar structural features or aspects of the subject disclosure. For purposes of explanation and illustration and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2 and 3, as will be described. The systems and methods described herein can be used to provide shoot through protection for single supply gate driver architectures.

The switch control system 100 includes a first voltage source $+V_{GD\_TOP}$ configured to output a first source voltage on a first voltage line 102. A first gate driver 104 is connected to a first gate control signal line 106 to receive a gate control signal from a controller 108. The first gate driver 104 is connected to the first voltage line 102 to receive the first source voltage. The first gate driver 104 is connected to a first terminal line 110 to output a first gate voltage signal to a first terminal 112 of a first switch 114.

A second gate driver 116 is connected to a second gate control signal line 119 to receive a gate control signal from the controller 108. The second gate driver 116 is connected to the first voltage line 102 to receive the first source voltage. The second gate driver 116 is connected to a second terminal line 118 to output a second gate voltage signal to a second terminal 120 of the first switch 114.

A second voltage source $+V_{GD\_BOT}$ is configured to output a second source voltage on a second voltage line 103. The first and second voltage sources $+V_{GD\_BOT}$ and $+V_{GD\_TOP}$ are two separate isolated positive voltage sources. A third gate driver 122 is connected to the first gate control signal line 106 to receive a gate control signal from a controller 108. The third gate driver 122 is connected to the second voltage line 103 to receive the second source voltage. The third gate driver 122 is connected to a third terminal line 124 to output a third gate voltage signal to a first terminal 126 of a second switch 128.

A fourth gate driver 130 is connected to the second gate control signal line 119 to receive a gate control signal from the controller 108. The fourth gate driver 130 is connected to the second voltage line 103 to receive the second source voltage. The fourth gate driver 130 is connected to a fourth terminal line 134 to output a fourth gate voltage signal to a second terminal 132 of the second switch 128.

An electric motor control assembly includes the first and second switches 114, 128 wherein the second terminal 120 of the first switch is connected to a third terminal 144 of the second switch 128. A motor phase line 146 is connected to the line connecting the second terminal 120 of the first switch 114 and the third terminal 144 of the second switch 128. The third terminal 148 of the first switch 114 is connected to a bus, $DC_{BUS}$ and the second terminal 126 of the second switch 128 is connected to a ground $DC_{BUS\_RTN}$.

Each of the first and second switches 114, 128 can be a MOSFET, an IGBT, or any other suitable type of switching device. The respective first terminal 112, 132 of each of the first and second switches is a respective gate. The second terminal 120, 126 of each of the first and second switches 114, 128 is a respective source or emitter, depending on the type of switching device used. The first gate voltage signal and the second gate voltage signal, e.g. in lines 106, 119 between the logic component 140 and the gate drivers 104, 116, 122, 130, are exactly inverted relative to one another to cause gate voltage at the switches 114, 128 to be bipolar. Each of the first through fourth gate drivers 104, 116, 122, 130 are connected to a ground, $RTN_{TOP}/RTN_{BOT}$ via a ground line 142. Each gate driver 104, 116, 122, 130 is configured to selectively output the source voltage ($+V_{GD\_TOP}/+V_{GD\_BOT}$) or ground voltage ($RTN_{TOP}/RTN_{BOT}$) as a function of the gate control signal from the controller 108.

When the output of the first and third gate drivers 104, 122 is the source voltage, the output of the second and fourth gate drivers 116, 130 is ground voltage such that the gate 112, 132 of each switch 114, 128 is connected to the source voltage and the source or emitter 120, 126 of each switch 114, 128 is connected to ground voltage. When the output of the first and third gate drivers 104, 122 is ground voltage, the output of the second and fourth gate drivers 116, 130 is the source voltage such that the gate 112, 132 of each switch 114, 128 is connected to the ground voltage and the source or emitter 120, 126 of each switch 114, 128 is connected to source voltage.

Each of the gate drivers 104, 116, 122, 130 driver includes shoot through protection (STP) 136 configured to prevent the first switch 114 and the second switch 128 from ever both being closed at once thereby preventing shoot voltages from a DC bus 138 to ground ($DC_{BUS\_RTN}$) through the first and second switches 114, 128. The STP 136 includes a logic component, e.g. glue logic 140, connected in the first and second gate control signal lines 106, 118 between the controller 108 and the gate drivers 104, 116, 122, 130.

With referenced now to FIG. 1 and TABLE 1 of FIG. 3, here is shown a truth table of how the gate voltages are generated with the pulse width modulation (PWM) signal (Gate_Top, Gate_Bot) logic from the intelligence or controller 108. This table is for a single driver having both channels and two different gate drivers of single channels. Under normal working conditions, the complementary logic at the gate driver input generates the bipolar gate voltages. Under fault conditions, the gate differential voltage becomes zero and drives the power switches 114, 128 to be in the OFF condition avoiding the shoot through. This feature also robust during the dead time.

With continued reference to TABLE 1, the logic component 140 includes logic configured to cause the gate drivers 104, 116, 122, 130 to open both the first and the second switch 114, 128 if the controller 108 signals a logic high on both the first and second gate control signal lines 106, 118 simultaneously. The logic component 140 includes logic configured to cause the gate drivers 104, 116, 122, 130 to open both the first and the second switch 114, 128 if the controller 108 signals a logic low on both the first and second gate control signal lines 106, 118 simultaneously.

Shoot Through Protection (STP) in a bi-polar gate driver output with single power supply is achieved with the following:
1. complementary logic between "Gate_Top and Gate_Bot" signals either at the controller/intelligence or glue logic based on the implementation;
2. connecting two sets of gate drivers; and
3. the output voltages (gate driver voltages to QTop, QBot) during above conditions 1 and 2.

The STP 136 includes logic configured to command the first and second gate control signal lines 106, 118 to the gate drivers 104, 116, 122, 130 according to the normal working condition as listed in TABLE 1 during normal operation, wherein the voltages listed in the top row of TABLE 1 are also labeled in FIG. 1. The STP 136 includes logic configured to command the first and second gate control signal lines 106, 118 according to the fault working condition as listed in TABLE 1 during faulted operation. Note that TABLE 1 refers to both $V_{GD\_TOP}$ and $V_{GD\_BOT}$ voltages as $V_{GD}$ for sake of clarity.

Figure 2:
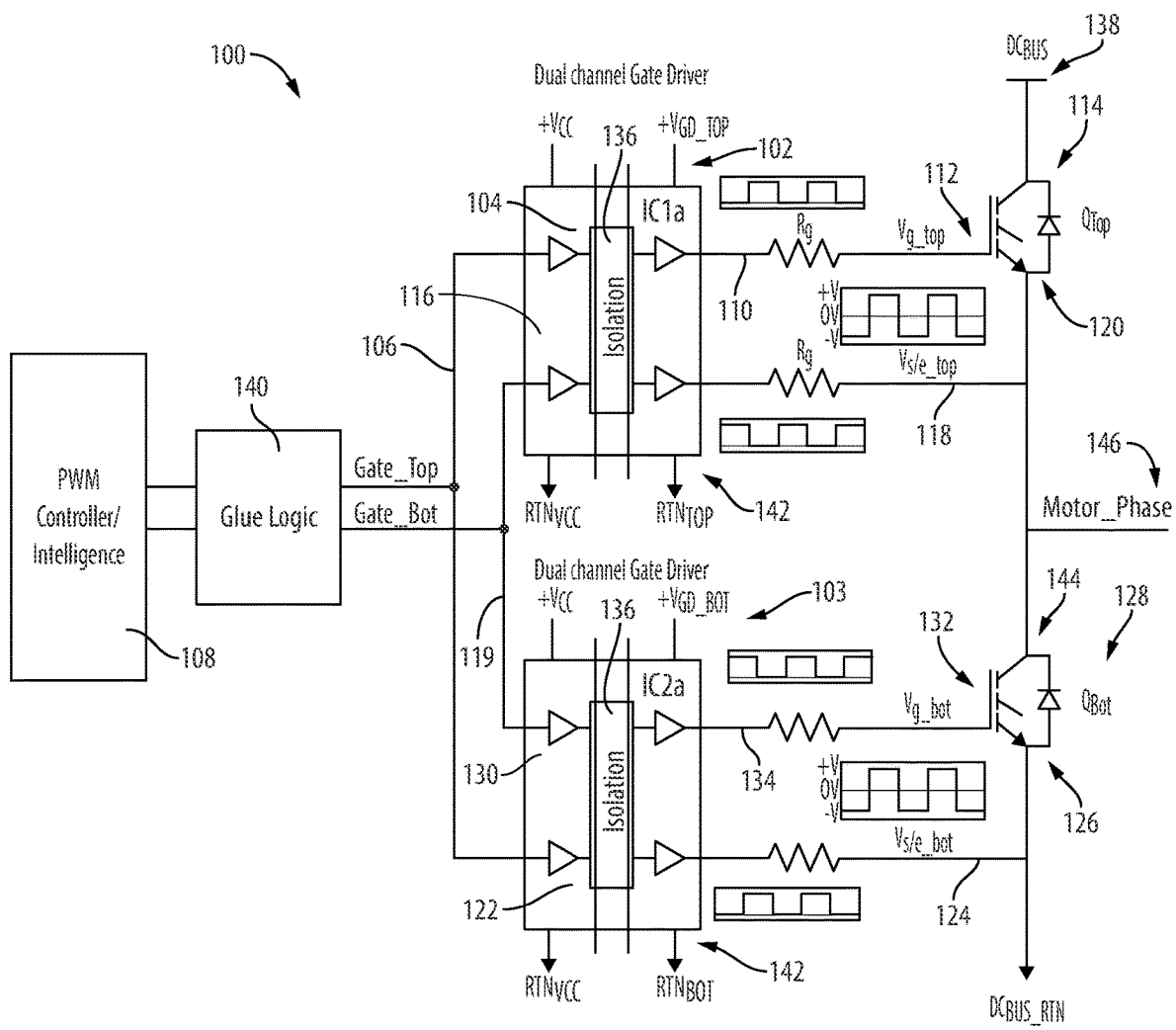
FIG. 2 is a is a schematic view of the system of FIG. 1, showing the first and second gate drivers in one integrated circuit, and the third and fourth gate drivers in a second integrated circuit.

In FIG. 1, the first gate driver 104, the second gate driver 116, the third gate driver 122, and the fourth gate driver 130 is each be hosted on separate respective integrated circuit IC1, IC2, IC3, IC4 such that the system 100 includes two voltage line branches 102, 103 and two ground line branches 142. It is also contemplated, as shown in FIG. 2, that the first gate driver 104 and the second gate driver 116 are integrated together in a single integrated circuit IC1a such that the system includes a single voltage line 102 to the single integrated circuit IC1a and a single ground line 142 from the single integrated circuit IC1a. Similarly, the third gate driver 122 and the fourth gate driver 130 in FIG. 2 are integrated together in a second single integrated circuit IC2a such that the system includes a single voltage line 103 to the second integrated circuit IC2a and a single ground line 142 from the second integrated circuit IC2a.

Systems and methods of this disclosure provide an STP feature while generating the bipolar gate emitter/source voltage (±Vge/±Vgs) using a unipolar/single supply gate driver as shown in FIGS. 1 and 2. The inputs of the gate drivers, which can be commercial off the shelf (COTS) gate drivers, are connected to the intelligence (e.g. with glue logic component 140) and both of these signals are complementary to establish STP feature while generating the bipolar gate voltages. The output of the first gate driver (IC1) Vg, (referenced to power supply GND_RTN) is connected to gate 112 of the power switch 114 and the output of the second gate driver (IC2), Ve/s (referenced to power supply GND_RTN) is connected to the emitter/source 120 of the power switch 114. The differential voltage between Vg and Ve/s gives the differential voltage which is bi-polar in nature (±volts). This technique can be used for any COTS gate driver with two channels (IC1a) available as shown in the FIG. 2. In this case, two channels are required for intelligence to generate the differential gate voltages. Since the input signals are passed to both gate drive channels, the propagation delay will be same and any failure in the gate driver reflects in the output and fails in same way which enhances the STP feature to be more robust and reliable than in traditional techniques.

Both solutions mentioned in FIGS. 1 and 2 are available architectures for the STP protection under different gate drive component availability and both serve the purpose for this disclosure. But there is always a benefit of having both gate driver channels in a single chip as in FIG. 2, which makes the protection more robust since the output channel fault voltage remains the same (either high or low) unlike the two different chips configuration of FIG. 1, where output fault conditions are uncertain.

Various potential advantages of systems and methods as disclosed herein include the following. The disclosed configurations protect the shoot through protection under any power up, power down sequencing, device and power supply fault conditions. Systems and methods disclosed herein can be simple and easy to implement for STP with any COTS gate driver components without any additional components. Fail safe inverter protection can be provided with gate driver fault as well. Systems and methods as disclosed herein can utilize COTs devices to provide bipolar voltages with single gate power supply and STP protection. Systems and methods as disclosed herein can be configured so there is no single point failure which can turn on the power switches unintentionally.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," "system," or "logic." A "circuit," "module," "logic," or "system" can include one or more portions of one or more separate physical hardware and/or software components that can together perform the disclosed function of the "logic," "circuit," "module," or "system", or a "circuit," "logic," "module," or "system" can be a single self-contained unit (e.g., of hardware and/or software). Furthermore, aspects of this disclosure may take the form of a computer program product embodied in one or more computer readable medium(s) having computer readable program code embodied thereon.

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

The methods and systems of the present disclosure, as described above and shown in the drawings, provide for shoot through protection in single supply gate driver architectures. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A switch control system, comprising:
    a first voltage source configured to output a first source voltage on a first voltage line;
    a first gate driver connected to a first gate control signal line to receive a first gate control signal, wherein the first gate driver is connected to the first voltage line to receive the first source voltage, and wherein the first gate driver is connected to a first terminal line to output a first gate voltage signal to a first terminal of a first switch;
    a second gate driver connected to a second gate control signal line to receive a second gate control signal, wherein the second gate driver is connected to the first voltage line to receive the first source voltage, and wherein the second gate driver is connected to a second terminal line to output a second gate voltage signal to a second terminal of the first switch;
    a second voltage source configured to output a second source voltage on a second voltage line;
    a third gate driver connected to the first gate control signal line to receive the first gate control signal, wherein the third gate driver is connected to the second voltage line to receive the second source voltage, and wherein the third gate driver is connected to a third terminal line to output a third gate voltage signal to a first terminal of a second switch; and
    a fourth gate driver connected to the second gate control signal line to receive the second gate control signal, wherein the fourth gate driver is connected to the second voltage line to receive the second source voltage, and wherein the fourth gate driver is connected to a fourth terminal line to output a fourth gate voltage signal to a second terminal of the second switch,
    wherein each of the first gate driver, the second gate driver, the third gate driver, and the fourth gate driver includes shoot through protection (STP) configured to prevent the first switch and the second switch from ever both being closed at once even when the first gate control signal and the second gate control signal have a differential voltage of substantially zero with respect to each other, thereby preventing shoot voltages from a DC bus to ground through the first and second switches.

2. The system as recited in claim 1, wherein the STP includes a logic component connected in the first and second gate control signal lines between a controller and the gate drivers, and wherein the logic component includes logic configured to cause the gate drivers to open both the first and second switches if the controller signals a logic high on both the first and second gate control signal lines simultaneously.

3. The system as recited in claim 1, wherein the STP includes a logic component connected in the first and second gate control signal lines between a controller and the gate drivers, and wherein the logic component includes logic configured to cause the gate drivers to open both the first and second switches if the controller signals a logic low on both the first and second gate control signal lines simultaneously.

4. The system as recited in claim 1, wherein the first and second voltage sources are two separate isolated positive voltage sources.

5. The system as recited in claim 1, wherein the STP includes logic configured to command the first and second gate control signal lines according to a normal working condition as listed in TABLE 1 during normal operation.

6. The system as recited in claim 1, wherein the STP includes logic configured to command the first and second gate control signal lines according to a fault working condition as listed in TABLE 1 during faulted operation.

7. The system as recited in claim 1, wherein:
    the first terminal of each of the first and second switches is a respective gate; and
    the second terminal of each of the first and second switches is a respective source or emitter.

8. The system as recited in claim 7, wherein the first gate voltage signal and the second gate voltage signal are exactly inverted to cause gate voltage at the first and second switches to be bipolar.

9. The system as recited in claim 4, wherein each of the gate drivers is connected to a ground via a ground line, and wherein each gate driver is configured to selectively output a corresponding source voltage or ground voltage as a function of a corresponding gate control signal.

10. The system as recited in claim 5, wherein:
    when an output of the first and third gate drivers is a source voltage, an output of the second and fourth gate drivers is a ground voltage such that a gate of each switch is connected to the source voltage and a source or emitter of each switch is connected to the ground voltage; and
    when the output of the first and third gate drivers is the ground voltage, the output of the second and fourth gate drivers is the source voltage such that the gate of each switch is connected to the ground voltage and the source or emitter of each switch is connected to the source voltage.

11. The system as recited in claim 10, further comprising the first and second switches connected to the gate drivers.

12. The system as recited in claim 11, wherein each of the switches is a MOSFET or an IGBT.

13. The system as recited in claim 1, wherein the first gate driver and the second gate driver are integrated in a first single integrated circuit such that the system includes a single voltage line to the first single integrated circuit and a single ground line from the first single integrated circuit, and wherein the third gate driver and the fourth gate driver are integrated in a second single integrated circuit such that the system includes a single voltage line to the second single integrated circuit and a single ground line from the second single integrated circuit.

14. The system as recited in claim 1, wherein the first gate driver, the second gate driver, the third gate driver, and the fourth gate driver are hosted on separate integrated circuits such that the system includes two voltage line branches and two ground line branches.

15. The system as recited in claim 1, further comprising an electric motor control assembly including the first and second switches, wherein the second terminal of the first switch is connected to a third terminal of the second switch, and wherein a motor phase line is connected to a line connecting the second terminal of the first switch to the third terminal of the second switch.

16. A switch control system comprising:
a first voltage source configured to output a first source voltage on a first voltage line;
a first dual-channel gate driver connected to the first voltage line to receive the first source voltage, the first dual-channel gate driver comprising first and second gate drivers respectively connected to first and second gate control signal lines to respectively receive first and second gate control signals, the first gate driver connected to a first terminal line to output a first gate voltage signal to a first terminal of a first switch, the second gate driver connected to a second terminal line to output a second gate voltage signal to a second terminal of the first switch;
a second voltage source configured to output a second source voltage on a second voltage line; and
a second dual-channel gate driver connected to the second voltage line to receive the second source voltage, the second dual-channel gate driver comprising third and fourth gate drivers respectively connected to the first and second gate control signal lines to respectively receive the first and second gate control signals, the third gate driver connected to a third terminal line to output a third gate voltage signal to a first terminal of a second switch, the fourth gate driver connected to a fourth terminal line to output a fourth gate voltage signal to a second terminal of the second switch;
wherein each of the first and second dual-channel gate drivers includes shoot through protection (STP) configured to prevent the first switch and the second switch from ever both being closed at once even when the first gate control signal and the second gate control signal have a differential voltage of substantially zero with respect to each other, thereby preventing shoot voltages from a DC bus to ground through the first and second switches.

17. The system as recited in claim 16, wherein the STP includes a logic component connected in the first and second gate control signal lines between a controller and the first and second dual-channel gate drivers, and wherein the logic component includes logic configured to cause the gate drivers to open both the first and second switches if the controller signals a logic high on both the first and second gate control signal lines simultaneously.

18. The system as recited in claim 16, wherein the STP includes a logic component connected in the first and second gate control signal lines between a controller and the first and second dual-channel gate drivers, and wherein the logic component includes logic configured to cause the gate drivers to open both the first and second switches if the controller signals a logic low on both the first and second gate control signal lines simultaneously.

19. The system as recited in claim 16, wherein the first and second voltage sources are two separate isolated positive voltage sources.

20. The system as recited in claim 16, wherein:
the first terminal of each of the first and second switches is a respective gate; and
the second terminal of each of the first and second switches is a respective source or emitter.

* * * * *